United States Patent [19]

Morong, III

[11] 4,383,222

[45] May 10, 1983

[54] HALF-WAVE SIGNAL ISOLATOR WITH COMPENSATOR MEANS TO REDUCE TEMPERATURE-DEPENDENT EFFECTS

[75] Inventor: William H. Morong, III, Newton, Mass.

[73] Assignee: Analog Devices, Incorporated, Norwood, Mass.

[21] Appl. No.: 203,476

[22] Filed: Nov. 3, 1980

[51] Int. Cl.³ .............................................. H03F 3/38
[52] U.S. Cl. ......................................... 330/9; 330/10; 330/75; 330/165
[58] Field of Search ........................ 330/9, 10, 75, 165

[56] References Cited

U.S. PATENT DOCUMENTS

| | | | |
|---|---|---|---|
| 3,405,366 | 10/1968 | Philbrick | 330/10 X |
| 3,946,324 | 3/1976 | Smith | 330/10 |
| 3,956,707 | 5/1976 | Bruyère | 330/10 |
| 4,191,929 | 3/1980 | Max et al. | 330/10 |

Primary Examiner—James B. Mullins

Attorney, Agent, or Firm—Parmelee, Bollinger & Bramblett

[57] ABSTRACT

A signal isolator including a coupling transformer with modulate/demodulate switches in series with the primary and secondary windings. The switches are driven in synchronism by an oscillator. Resonating capacitors are connected in parallel with the transformer windings and tuned to the switch operating frequency to control the flux in the transformer core. A transformer turns-ratio of less than unity introduces a corresponding attenuation, and a following amplifier counteracts that attenuation to produce an output signal at the original level. A return current resistor is connected between the output signal and the transformer secondary to produce a back-flow of current towards the transformer. This current provides for supplying the losses of the coupling circuit in a symmetrical fashion, both from the isolator input and its output, to reduce significantly variations in performance resulting from changes in ambient temperature.

8 Claims, 2 Drawing Figures

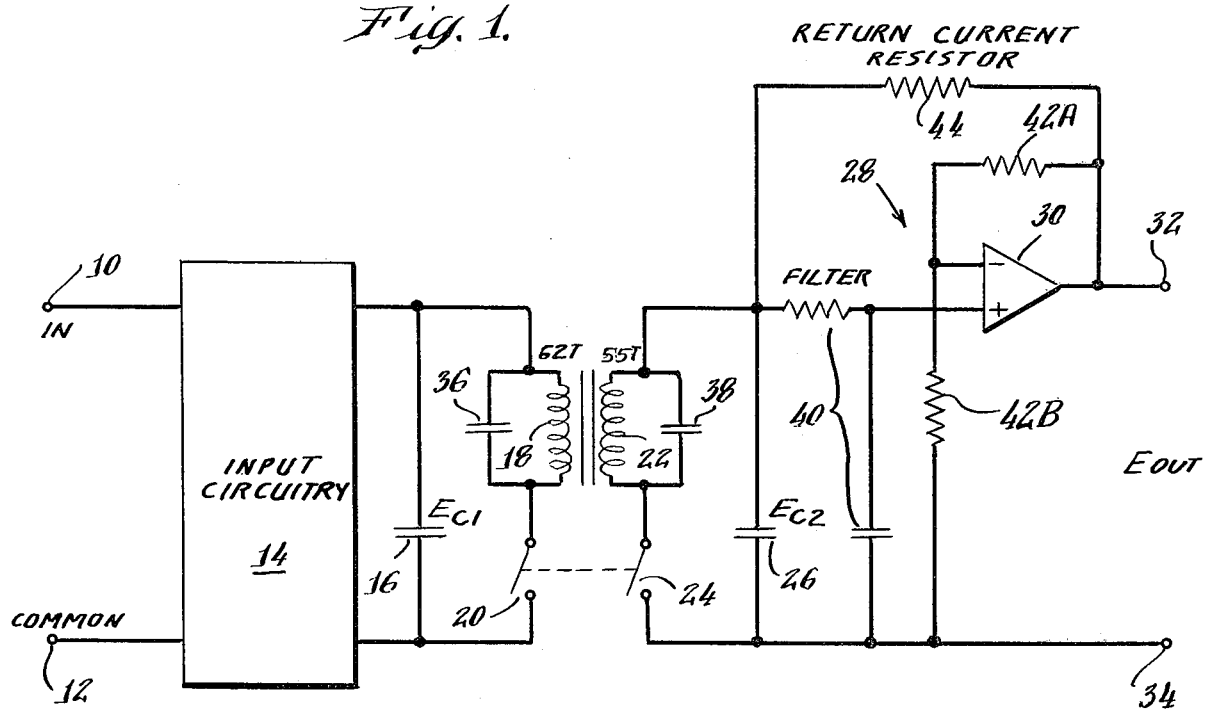

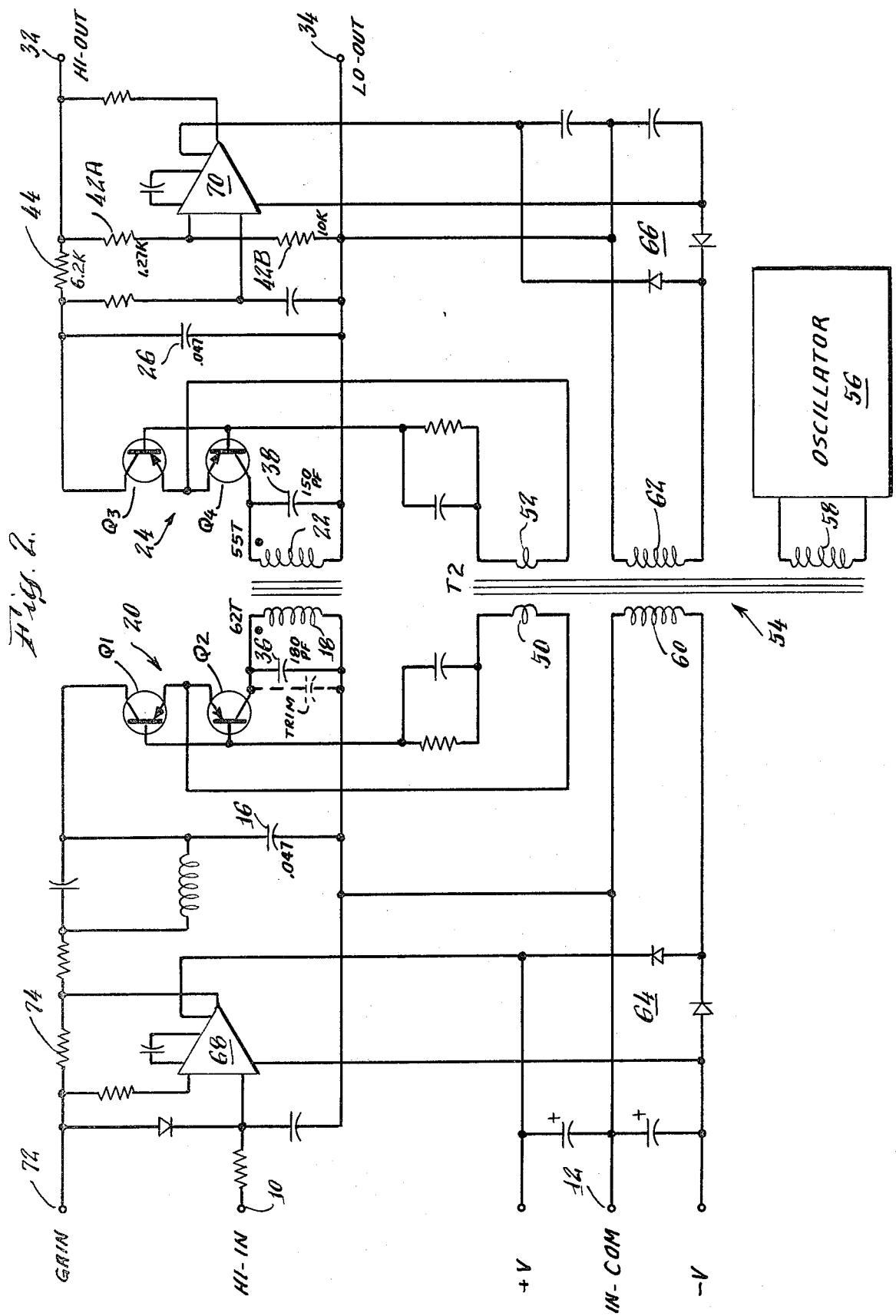

HALF-WAVE SIGNAL ISOLATOR WITH COMPENSATOR MEANS TO REDUCE TEMPERATURE-DEPENDENT EFFECTS

BACKGROUND OF THE INVENTION

1. Field of the Invention

This invention relates to electrical signal isolators for translating a signal level without establishing any conductive connection between input and output. More particularly, this invention relates to half-wave transformer-coupled isolators.

2. Description of the Prior Art

Electrical signal isolators are used in a wide variety of electrical systems, to enable signal levels to be translated from one part of a system to another without permitting the flow of direct current therebetween. Isolators are used in diverse applications such as industrial process control systems, making medical measurements of the human body, and so on.

A number of different types of isolators have been used in the past. Many isolators employ transformer coupling to establish a signal path without DC conductivity. Reference in that regard may be made to U.S. Pat. Nos. 3,946,324 (L. R. Smith), 4,054,829 (T. J. Searle), and 4,066,974 (C. J. Reinhard) simply as illustrative of different kinds of isolators; many other kinds of transformer-coupled isolators are described in still other patents and publications.

One type of transformer-coupled isolator which has significant advantages is that referred to as a half-wave isolator. In such an arrangement, the d-c input signal is modulated (chopped) by an electronic switch connected in series with the transformer primary. The switch typically is driven by an oscillator carrier signal so as to close the series circuit to the transformer primary on alternate half-cycles. A corresponding demodulator switch is employed in series with the transformer secondary winding to recover the d-c signal level. The demodulator switch is driven by the same oscillator signal as the modulator switch, so as to establish synchronism between the two switches.

Such half-wave signal isolators have been used extensively heretofore. However, prior isolators of that type have suffered from certain serious problems which have made such devices less than satisfactory, particularly for applications with demanding performance requirements. For example, such devices commonly are subject to undesirable drift, especially as a result of variations in ambient temperature. Adverse effects can be caused by a variety of factors, such as drift of the oscillator frequency, drift of the reactance of the coupling transformer, temperature dependence of the switch resistances, and so on. The present invention is directed at minimizing such adverse effects.

SUMMARY OF THE INVENTION

In a preferred embodiment of the invention, to be described hereinbelow in detail, a half-wave signal isolator is provided with return current means coupled between the isolator output and the secondary of the transformer. This back-flowing current corresponds, in somewhat symmetric fashion, to the net forward current flowing towards the transformer primary from the amplifier input, i.e. current which supplies unavoidable losses in the circuitry. In effect, losses in the isolator coupling circuitry are supplied by two oppositely-directed currents developed by signal sources at both the input and the output of the isolator. The arrangement described serves to minimize adverse effects on the isolator performance produced by drift of the frequency of operation of the modulator/demodulator circuitry, drift in the value of the transformer inductance, and so on. Advantageously, as in the presently preferred embodiment, the transformer turns ratio may be set to a value less than unity, and the resulting attenuation compensated for by providing an output amplifier with a gain which is correspondingly greater than unity.

Accordingly, it is an object of this invention to provide an improved half-wave signal isolator. A more specific object of the invention is to reduce the effects on isolator performance of variations in ambient temperature. Other objects, aspects and advantages of the invention will in part be pointed out in, and in part apparent from, the following detailed description of the presently preferred embodiment of the invention, considered together with the accompanying drawings.

BRIEF DESCRIPTION OF THE DRAWINGS

FIG. 1 is a simplified schematic diagram, partly in block format, of an isolator in accordance with the invention; and FIG. 2 is a detailed schematic diagram of a presently preferred signal isolator in accordance with the invention.

DESCRIPTION OF THE PREFERRED EMBODIMENT

Referring now to FIG. 1, a half-wave signal isolator in accordance with this invention includes a pair of terminals 10, 12 to receive a d-c input signal. (Although this signal is referred to as d-c, it will be understood that this term is intended also to encompass signals in the audio range or slightly higher.) The input signal is applied first to input circuitry generally indicated at 14, and which may, for example, comprise conventional circuitry including elements such as filters, amplifiers, and so on, adapted to produce a corresponding voltage signal designated as $E_{C1}$. This voltage is applied to a reservoir capacitor 16, providing a relatively large storage capacity to minimize fluctuations in the voltage level during operation of the modulator circuit to be described.

The voltage $E_{C1}$ is connected to a modulator circuit comprising a transformer primary winding 18 in series with a switch 20. (Although this switch is illustrated as a mechanical device, in the preferred embodiment it would actually be an electronic switch.) The transformer secondary 22 is similarly connected in series with a synchronized demodulator switch 24, and to a second reservoir capacitor 26 which recovers an output voltage level $E_{C2}$ corresponding to $E_{C1}$. This output voltage is applied to output circuitry generally indicated at 28 including an amplifier 30 which produces an output signal at the output terminals 32, 34.

The transformer windings 18 and 22 preferably are provided with resonating capacitors 36, 38 connected in parallel with the transformer windings respectively. These capacitors and associated windings form a resonant LC tank circuit, tuned to a frequency approximately equal to the frequency of operation of the switches 20, 24. This resonant characteristic controls the flux in the transformer core so as to substantially minimize instability effects which otherwise would occur upon each opening of the switches. A detailed explanation of this aspect of the signal isolator is set forth in copending application Ser. No. 203,451, filed Nov. 3, 1980 by the present applicant, and thus will not be repeated herein.

The transformer windings 18, 22 have a turns ratio less than unity, to provide for attenuation of signals passing through the transformer. Thus the voltage $E_{C2}$ at the second reservoir capacitor 26 is less than the voltage $E_{C1}$ at the first reservoir capacitor 16 in accordance with the turns ratio selected. The specific turns ratio in the preferred embodiment was 62/55, for an attenuation factor of 1.127:1. However, it should be understood that there is no restriction in that respect.

The attenuated voltage $E_{C2}$ is applied through a filter 40 to the positive input terminal of amplifier 30. The gain of the amplifier is controlled by a series feedback circuit to the negative input terminal comprising resistors 42A, 42B having an ohmic ratio to produce (in this embodiment) an amplifier gain of 1.127. This amplifier gain exactly compensates for the attenuation introduced by the less-than-unity transformer turns-ratio, to produce an output signal at terminal 32 corresponding to $E_{C1}$. This output signal thus is 1.127 times greater than the voltage $E_{C2}$ on the second reservoir capacitor 26.

A return current resistor 44 is connected directly between the output terminal 32 and the transformer secondary 22 with the second reservoir capacitor 26 connected thereto. Since the voltage on the output terminal 32 is greater than the voltage $E_{C2}$, current will flow from the output terminal back to the capacitor 26, and to the transformer coupled thereto.

It has been found that this arrangement significantly minimizes drift effects in the performance of the isolator. If the frequency of switch operation varies, or if there are changes in the transformer windings resulting from temperature variations, corresponding changes in the output of the isolator will be reduced, as a result of this temperature-compensating arrangement. The losses of the coupling circuitry are being supplied, in a somewhat symmetrical fashion, by currents derived from both the input side and the output side of the isolator. It appears that the voltage drops resulting from such loss currents tend to cancel out, and thereby reduce variations in the isolator output which otherwise would be caused by changes in the voltage drops.

With respect to the resonant character of the circuitry, the overall effect can be seen as a broadening of the Q of the circuit including the transformer windings. Thus the effects of changes in switch operating frequency, or in the value of the transformer reactance, are reduced as a result of the flatter shape of the tuning curve. This flattening effect is however achieved without increasing losses in the resonant circuit.

FIG. 2 shows the circuit details of a commercial isolator embodying the present invention. It will be seen that the switches 20 and 24 are formed by transistor pairs Q1, Q2; Q3, Q4, driven by control signals from drive windings 50, 52 on a separate transformer 54. An oscillator 56 is coupled to a primary winding 58 of this transformer 54 to supply synchronized switch drive signals to windings 50, 52. The transformer 54 also includes power windings 60, 62 which are coupled to respective rectifier circuits 64, 66 for developing d-c operating voltages for input and output amplifiers 68, 70. The isolator input circuitry includes a gain terminal 72 to provide for connection of a gain resistor (not shown) between that terminal and the common terminal 12. The overall gain of the isolator will be determined by the ratio of such gain resistor to the value of a feedback resistor 74 of the input amplifier 68.

Although a specific preferred embodiment of this invention has been described hereinabove in detail, it is desired to emphasize that this has been for the purpose of illustrating the invention, and should not be considered as necessarily limitative of the invention, it being understood that many modifications can be made by those skilled in the art while still practicing the invention claimed herein.

I claim:

1. In a signal isolator of the half-wave type comprising a coupling transformer having primary and secondary windings; first and second switches connected to said transformer windings, respectively, one of said switches serving to modulate a signal applied to the transformer primary and the other serving to demodulate the signal developed at the secondary of said transformer; means for driving said switches in synchronism at a relatively high frequency; and output circuit means coupled to said transformer secondary and operable to produce an output signal corresponding to the input signal;

that improvement in such signal isolator comprising:
return current means connected between said output circuit means and said transformer secondary for directing to said transformer secondary a current responsive to said output signal to augment supplying of the losses in the coupling circuitry.

2. A signal isolator as in claim 1, including resonating capacitor means coupled to at least one of the transformer windings to form a resonant circuit tuned at least approximately to said frequency of switch operation.

3. A signal isolator as in claim 1, wherein said output circuit means comprises an amplifier arranged to produce said output signal;
said return current means comprising a resistor connected between the output of said amplifier and said transformer secondary.

4. A signal isolator as in claim 1, wherein said transformer is arranged to provide an input/output ratio R which is less than unity; and
said output circuit means including means to increase the value of said output signal by a factor at least substantially equal to 1/R to provide a net overall gain of unity.

5. A signal isolator as in claim 4, wherein the turns ratio of said transformer is set at R;
means coupled to said transformer secondary winding to produce a demodulated voltage corresponding to the input voltage applied to the transformer primary; and
an amplifier with its input receiving said demodulated voltage;
said amplifier including means to fix its gain at at least approximately R.

6. A signal isolator as in claim 5, including a filter connected between said demodulated voltage and said amplifier input.

7. A signal isolator of the half-wave type comprising:
a transformer having primary and secondary windings having primary-to-secondary turns ratio R less than unity;
first and second synchronously driven switch means connected to said primary and secondary windings respectively to form therewith corresponding first and second series circuits;

first and second reservoir capacitors connected across said first and second series circuits;

an amplifier having its input coupled to said second reservoir capacitor and arranged to produce an output signal related to its input voltage by a ratio of approximately R; and return current resistor means coupled between said output signal and said transformer secondary winding to augment supplying of the losses in the coupling circuitry.

8. A signal isolator as in claim 7, including capacitor means coupled to at least one of said windings to form a resonant circuit tuned at least approximately to the frequency of operation of said switch means.

* * * * *